(12) United States Patent
Nam

(10) Patent No.: US 7,566,644 B2
(45) Date of Patent: Jul. 28, 2009

(54) METHOD FOR FORMING GATE ELECTRODE OF SEMICONDUCTOR DEVICE

(75) Inventor: Ki Won Nam, Gyeonggi-do (KR)

(73) Assignee: Hynix Semiconductor Inc., Icheon-si (KR)

(*) Notice: Subject to any disclaimer, the term of this patent is extended or adjusted under 35 U.S.C. 154(b) by 246 days.

(21) Appl. No.: 11/142,362

(22) Filed: Jun. 2, 2005

(65) Prior Publication Data

US 2005/0272232 A1   Dec. 8, 2005

(30) Foreign Application Priority Data

Jun. 2, 2004   (KR) ................... 10-2004-0040082

(51) Int. Cl.
    *H01L 21/20* (2006.01)
(52) U.S. Cl. .............. 438/585; 438/592; 438/593; 438/596; 438/747; 257/E21.209; 257/E21.252; 257/E21.256; 257/E21.679; 257/E21.682; 257/E27.103; 257/E29.155
(58) Field of Classification Search ............ 438/12, 438/13, 40, 104, 85, 151, 149, 582, 581, 438/583, 585, 587, 598, 588, 682–685, 677, 438/673, 656, 655, 647–648, 700, 705, 710, 438/720, 722, 256, 268, 269, 592, 593, 596, 438/747, 752, 753; 257/412, E33.072, E21.232, 257/E33.03, E21.194, 209, 252, 256, 311, 257/312, 679, 682, E27.103, E29.155
See application file for complete search history.

(56) References Cited

U.S. PATENT DOCUMENTS

| | | | | |
|---|---|---|---|---|
| 6,660,587 B2* | 12/2003 | Ahn et al. | ..................... | 438/257 |
| 6,933,219 B1* | 8/2005 | Lingunis et al. | ............. | 438/593 |
| 7,018,930 B2* | 3/2006 | Lee et al. | ..................... | 438/706 |
| 7,029,999 B2* | 4/2006 | Lim et al. | ................... | 438/585 |
| 7,033,957 B1* | 4/2006 | Shiraiwa et al. | ............. | 438/770 |
| 7,154,779 B2* | 12/2006 | Mokhlesi et al. | ........ | 365/185.01 |
| 7,320,914 B1* | 1/2008 | Wada et al. | ................. | 438/260 |
| 7,371,669 B2* | 5/2008 | Youn et al. | .................. | 438/585 |
| 7,396,773 B1* | 7/2008 | Blosse et al. | ................. | 438/747 |
| 2005/0266665 A1* | 12/2005 | Youn et al. | .................. | 438/592 |

\* cited by examiner

*Primary Examiner*—Michael S Lebentritt
(74) *Attorney, Agent, or Firm*—Townsend and Townsend and Crew LLP

(57) ABSTRACT

A method for forming a gate electrode of a semiconductor device is provided wherein a hard mask layer which is a nitride film is deposited and subjected to an additional surface deposition process so that a matrix structure of a nitride film surface becomes more compact to reduce an etching ratio of the hard mask layer thereby increasing a thickness of the residual hard mask layer.

8 Claims, 2 Drawing Sheets

METHOD FOR FORMING GATE ELECTRODE OF SEMICONDUCTOR DEVICE

BACKGROUND OF THE INVENTION

1. Field of the Invention

The present invention generally relates to a method for forming a gate electrode of a semiconductor device, and more specifically, to a method for forming a gate electrode of a semiconductor device wherein a nitride hard mask layer is deposited and subjected to an additional surface treatment process whereby a lattice structure of a nitride film surface becomes more dense so as to reduce an etching rate of the hard mask layer during the formation process of a gate electrode, and increase a thickness of the residual hard mask layer.

2. Description of the Related Art

In accordance a conventional method for forming a gate electrode of a semiconductor device, a gate oxide film, a polysilicon layer, a metal layer and a hard mask layer are sequentially formed, an anti-reflection film is formed on a surface of the hard mask layer, and a photoresist film pattern defining a gate electrode region is formed. Thereafter, the hard mask layer is etched using the photoresist film pattern as an etching mask to form a hard mask layer pattern. The metal layer, the polysilicon layer, and the gate oxide film are then etched using the hard mask layer pattern as an etching mask to form a gate electrode of a semiconductor device.

In accordance with the above-described conventional method for forming a gate electrode of a semiconductor device, as the thickness of the residual hard mask layer becomes increased after the formation of the gate electrode, a margin of a SAC process is improved during an etching process of a landing plug contact hole. However, when the deposition thickness of the hard mask layer is increased, a line width of in the gate electrode a peripheral circuit region is increased and deformed.

SUMMARY OF THE INVENTION

Accordingly, it is an object of the present invention to provide a method for forming a gate electrode of a semiconductor device wherein a nitride hard mask layer is deposited and subjected to an additional surface treatment process whereby a lattice structure of a nitride film surface becomes more dense so as to reduce an etching rate of the hard mask layer during the formation of a gate electrode, and increase a thickness of the residual hard mask layer and preventing increase and deformation of a line-width of a peripheral circuit region.

In order to achieve the above-described object, there is provided a method for forming a gate electrode of a semiconductor device, comprising the steps of:

sequentially forming a gate oxide film, a polysilicon layer, a metal layer and a hard mask layer on a semiconductor substrate;

subjecting a surface of the hard mask layer to an oxidation process to form an oxidized hard mask layer;

forming a photoresist film pattern defining a gate region on the oxidized hard mask layer; and etching the hard mask layer, the metal layer, the polysilicon layer and the gate oxide film using the photoresist film pattern as an etching mask to form a gate electrode.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

FIGS. 1a through 1d are cross-sectional views illustrating a method for forming a gate electrode of a semiconductor device according to an embodiment of the present invention.

Figure 1A:
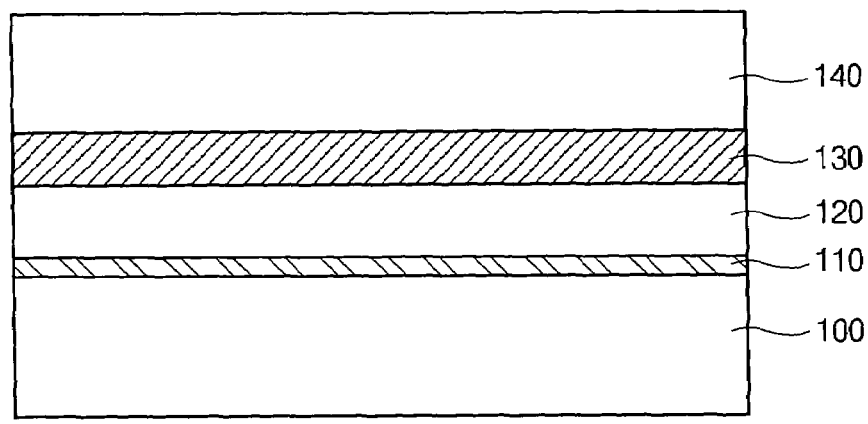
FIGS. 1a through 1d are cross-sectional views illustrating a method for forming a gate electrode of a semiconductor device according to an embodiment of the present invention.

Referring to FIG. 1a, a gate oxide film 110, a polysilicon layer 120, a metal layer 130 and a hard mask layer 140 are sequentially formed on a semiconductor substrate 100. Preferably, the metal layer 130 comprises a tungsten silicide film, and the hard mask layer 140 comprises a nitride film.

Figure 1B:
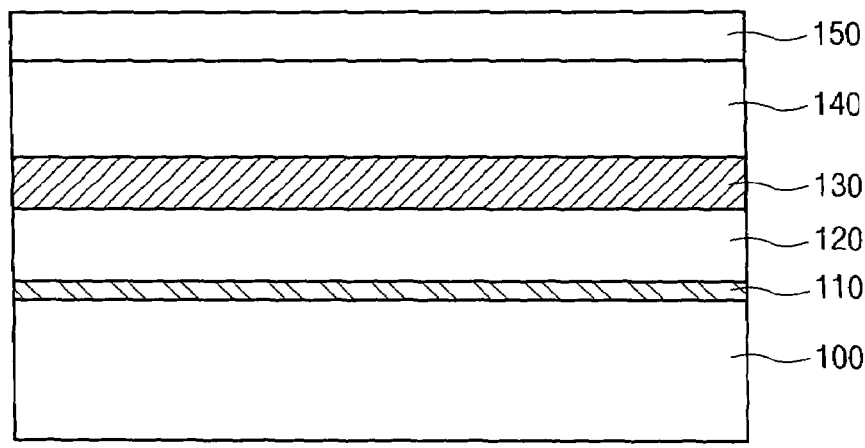

Referring to FIG. 1b, a surface of the hard mask layer 140 is subjected to an oxidation process.

The surface of the hard mask layer 140 is converted into an oxidized nitride film 150 by the oxidation process comprising a Remote Plasma Enhanced Atomic (hereinafter, referred to as "RPEA") method using an oxygen gas as a source. Preferably, the oxidation process comprising the RPEA method is performed at a temperature ranging from 250° C. to 350° C. Nitrogen ions on the surface of the hard mask layer 140 reacts with oxygen ions contained in the oxygen gas to form the oxidized nitride film $N_xO_y$, the oxidized nitride film 150 has a thickness ranges from 50 Å to 100 Å.

Figure 1C:
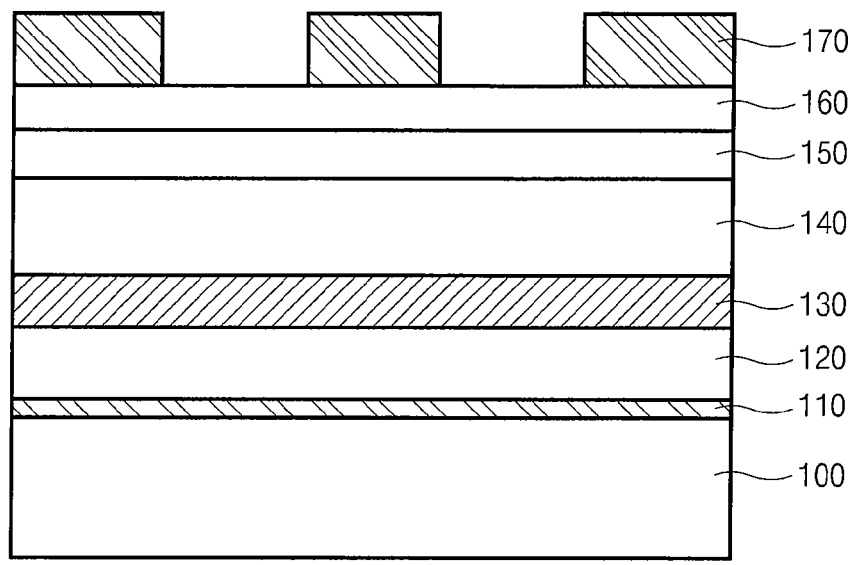

Referring to FIG. 1c, an anti-reflective coating (ARC) 160 is formed on the oxidized nitride film 150. A photoresist film pattern 170 defining a gate electrode region is then formed on the anti-reflective coating 160. Preferably, the anti-reflective coating film 160 comprise a silicon oxy nitride film.

Figure 1D:
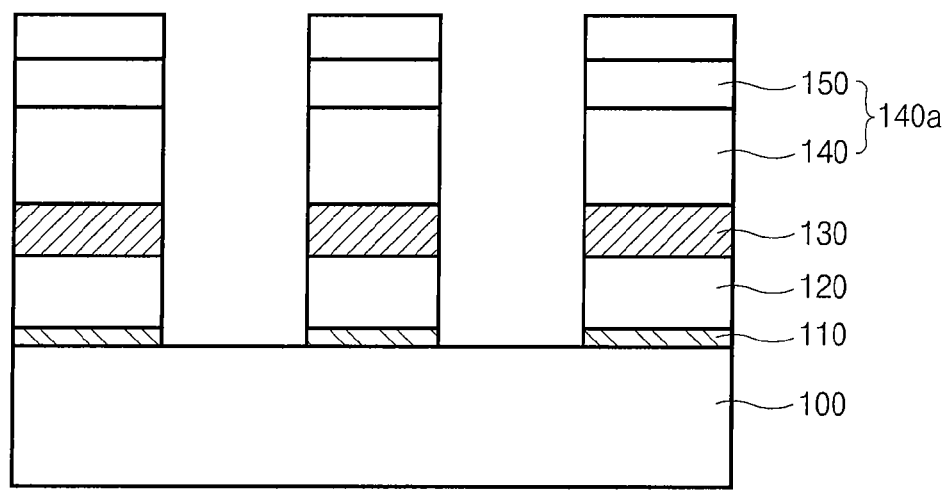

Referring to FIG. 1d, the hard mask layer 140 is etched using the photoresist film pattern 170 as an etching mask to form a hard mask layer pattern 140a. Thereafter the photoresist film pattern 170 is removed. The metal layer 130, the polysilicon layer 120 and the gate oxide film 110 are then etched using the a hard mask layer pattern 140a as an etching mask to form a gate electrode.

Accordingly, in the above-described method for forming a gate electrode of a semiconductor device according to an embodiment of the present invention, the bonding strength between the atoms on the surface of the hard mask layer is increased whereby a stable and bond is obtained. Therefore the etching rate of the hard mask layer is reduced to increase the thickness of the residual hard mask layer and is to improve a margin of a SAC process in a subsequent etching process for a landing plug contact hole. The deposition thickness of the hard mask layer which may be reduced to prevent increase and deformation of a line width of in a gate electrode peripheral circuit region.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A method for forming a gate electrode of a semiconductor device, the method comprising:
   forming a stacked structure of a gate oxide film, a polysilicon layer, a metal layer and a hard mask layer over a semiconductor substrate, wherein the hard mask layer comprises a nitride film;
   subjecting a surface of the hard mask layer to an oxidation process to form an oxidized hard mask layer so that a lattice structure of the surface of the hard mask layer is made more dense, the dense surface of the hard mask layer reducing the etching rate of the hard mask layer, wherein the oxidized hard mask layer comprises an oxidized nitride film;
   forming a photoresist film pattern defining a gate region over the oxidized hard mask layer; and
   etching the stacked structure using the photoresist film pattern as an etching mask to form a gate electrode.

2. The method according to claim 1, wherein the metal layer comprises a tungsten silicide film.

3. The method according to claim 1, further comprising forming a bottom anti-reflective coating on the hard mask layer, wherein the bottom anti reflective coating comprises a silicon oxy nitride film.

4. The method according to claim 1, wherein the oxidation process is performed via a RPEA (Remote Plasma Enhanced Atomic) method using an oxygen gas as a source.

5. The method according to claim 4, wherein the RPEA method is performed at a temperature ranging from 250° C. to 350° C.

6. The method according to claim 1, wherein a thickness of the oxidized hard mask layer ranges from 50 Å to 100 Å.

7. A method for forming a gate electrode of a semiconductor device, the method comprising:
   forming a stacked structure of a gate oxide film, a polysilicon layer, a metal layer and a hard mask layer over a semiconductor substrate, wherein the hard mask layer comprises a nitride film;
   subjecting a surface of the hard mask layer to an oxidation process to form an oxidized hard mask layer so that a lattice structure of the surface of the hard mask layer is made more dense, the dense surface of the hard mask layer reducing the etching rate of the hard mask layer, wherein the oxidized hard mask layer comprises an oxidized nitride film;
   forming a photoresist film pattern defining a gate region over the oxidized hard mask layer; and
   etching the stacked structure using the photoresist film pattern as an etching mask to form a gate electrode,
   wherein the oxidation process is performed via a Remote Plasma Enhanced Atomic (RPEA) method using an oxygen gas as a source.

8. The method according to claim 7, wherein the RPEA method is performed at a temperature ranging from 250° C. to 350° C.

* * * * *